US012765040B2

(12) United States Patent
Briggs et al.

(10) Patent No.: US 12,765,040 B2
(45) Date of Patent: Oct. 13, 2026

(54) METHOD FOR FORMING A SEMICONDUCTOR DEVICE STRUCTURE

(71) Applicant: IMEC VZW, Leuven (BE)

(72) Inventors: Basoene Briggs, Heverlee (BE); Boon Teik Chan, Wilsele (BE); Juergen Boemmels, Heverlee (BE)

(73) Assignee: Imec VZW, Leuven (BE)

( * ) Notice: Subject to any disclaimer, the term of this patent is extended or adjusted under 35 U.S.C. 154(b) by 613 days.

(21) Appl. No.: 18/067,954

(22) Filed: Dec. 19, 2022

(65) Prior Publication Data

US 2023/0197525 A1 Jun. 22, 2023

(30) Foreign Application Priority Data

Dec. 20, 2021 (EP) .................................... 21215814

(51) Int. Cl.
*H10D 84/03* (2025.01)
*H10D 30/01* (2025.01)
(Continued)

(52) U.S. Cl.
CPC ......... *H10D 84/038* (2025.01); *H10D 30/014* (2025.01); *H10D 30/43* (2025.01); *H10D 30/6735* (2025.01); *H10D 30/6739* (2025.01); *H10D 62/121* (2025.01); *H10D 64/01318* (2026.01); *H10D 64/017* (2025.01);
(Continued)

(58) Field of Classification Search
CPC ...... H10D 84/038; H10D 84/85; H10D 30/62; H01L 21/02532
See application file for complete search history.

(56) References Cited

U.S. PATENT DOCUMENTS

2020/0227305 A1 7/2020 Cheng et al.
2020/0357884 A1 11/2020 Xie et al.
(Continued)

FOREIGN PATENT DOCUMENTS

CN 113675089 A1 11/2021
CN 113675141 A 11/2021
CN 113764413 A 12/2021

OTHER PUBLICATIONS

Extended European Search Report and Written Opinion, Application No. EP 21215814.1, mailed Jun. 9, 2022, 8 pages.

*Primary Examiner* — Brian Turner
(74) *Attorney, Agent, or Firm* — McDonnell Boehnen Hulbert & Berghoff LLP

(57) ABSTRACT

A method for forming a semiconductor device structure includes forming a layer stack comprising alternating sacrificial layers of a first semiconductor material and channel layers of a second semiconductor material. The method includes forming over the layer stack a plurality of parallel and regularly spaced core lines and forming spacer lines on side surfaces of the core lines. The method includes forming first trenches extending through the layer stack by etching the layer stack while using the core lines and the spacer lines as an etch mask and forming insulating walls in the first trenches and in the gaps by filling the first trenches and the gaps with insulating wall material. The method also includes forming second trenches extending through the layer stack by etching the layer stack while using the spacer lines and the insulating walls as an etch mask, thereby forming a plurality of pairs of fin structures.

20 Claims, 10 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/85*** | (2025.01) |
| ***H10P 14/20*** | (2026.01) |

(52) U.S. Cl.

CPC ....... *H10D 84/0167* (2025.01); *H10D 84/017* (2025.01); *H10D 84/0177* (2025.01); *H10D 84/0188* (2025.01); *H10D 84/85* (2025.01); *H10P 14/3411* (2026.01); *H10P 14/3462* (2026.01)

(56) References Cited

U.S. PATENT DOCUMENTS

| | | | | |
|---|---|---|---|---|
| 2020/0357931 | A1* | 11/2020 | Lee | H10D 30/014 |
| 2021/0210631 | A1* | 7/2021 | Yeh | H01L 21/3065 |
| 2021/0375685 | A1* | 12/2021 | Xie | H10D 62/151 |
| 2021/0391222 | A1 | 12/2021 | Xie et al. | |
| 2023/0095140 | A1* | 3/2023 | Xie | H10D 30/43 257/288 |

* cited by examiner

METHOD FOR FORMING A SEMICONDUCTOR DEVICE STRUCTURE

CROSS-REFERENCE TO RELATED APPLICATIONS

The present application is a non-provisional patent application claiming priority to European patent application number 21215814.1, filed on Dec. 20, 2021, the contents of which are hereby incorporated by reference.

FIELD OF THE DISCLOSURE

The present disclosure relates to a method for forming a semiconductor device structure.

BACKGROUND

Modern semiconductor integrated circuit technology includes horizontal channel transistors, of which the FinFET, which has a gate straddling a fin-shaped semiconductor channel portion, is one example. Other examples include the horizontal or lateral nanowire FET (NWFET) and nanosheet FET (NSHFET). These transistor structures typically include a source, a drain, a channel comprising one or more nanowire or nanosheet-shaped channel layers extending horizontally along the substrate, and a gate stack. In a gate-all-around (GAA) design, the channel layers may extend through the gate stack such that the gate stack wraps all-around one or more of the channel portions.

Fabrication methods for horizontal NWFET or NSHFET devices may typically involve patterning a semiconductor layer stack of alternating sacrificial layers and channel layers to form fin structures comprising corresponding layer stacks of sacrificial and channel layers, e.g. of a nanowire or nanosheet shape. The fin structures may be subjected to further device processing steps, such as source/drain epitaxy, channel release and gate stack deposition, e.g. to form NW— of NSHFET devices.

The "forksheet" device is a design allowing an n-type NSHFET and a p-type NSHFET to be provided adjacent to each other, each controlled by a fork-shaped gate structure and separated by an insulating wall. The insulating wall may be formed between the p- and n-type device region before gate patterning. The wall may separate the p-gate trench from the n-gate trench, allowing a much tighter n-to-p spacing.

The structure of the forksheet device however introduces new challenges during fabrication. For example, the formation of the insulating wall complicates the fin patterning.

SUMMARY

An objective of the present disclosure is to address at least some of the above-mentioned fabrication challenges by providing an improved method for forming a semiconductor device structure. The semiconductor device structure may in particular be suitable for a forksheet device. In other words, the semiconductor device structure formed in accordance with the method may be suitable as a precursor or intermediate semiconductor structure to a method for forming a forksheet device.

According to an aspect there is provided a method for forming a semiconductor device structure, the method comprising:

forming a layer stack on a substrate, the layer stack comprising sacrificial layers of a first semiconductor material and channel layers of a second semiconductor material, the channel layers alternating the sacrificial layers;

forming over the layer stack a plurality of parallel and regularly spaced core lines;

forming spacer lines on side surfaces of the core lines, wherein a width of the spacer lines is such that gaps are formed between spacer lines formed on neighboring core lines;

forming first trenches extending through the layer stack by etching the layer stack while using the core lines and the spacer lines as an etch mask;

forming insulating walls in the first trenches and in the gaps by filling the first trenches and the gaps with insulating wall material;

subsequent to forming the insulating walls, removing the core lines selectively to the spacer lines and the insulating walls; and subsequent to removing the core lines, forming second trenches extending through the layer stack by etching the layer stack while using the spacer lines and the insulating walls as an etch mask, thereby forming a plurality of pairs of fin structures, each pair of fin structures comprising a first device layer stack and a second device layer stack separated by a respective insulating wall.

An example method enables forming of plural pairs of fin structures, with a regular and tight spacing, with a high degree of precision and control. The width dimension of the fin structures may be controlled by the width of the spacer lines. The width of the insulating walls is dependent on the width of the gaps between the spacer lines, which may be controlled by the spacing of the core lines and the width of the spacer lines. Meanwhile, as the first trenches for the insulating walls are formed separately from the second trenches separating the pairs of the fin structures, the height of the insulating wall and the depth of the second trenches may be individually controlled.

Each one of the resulting pairs of fin structures may comprises a first device layer stack and a second device layer stack, each comprising a same sequence of sacrificial layers of the first semiconductor material and channel layers of the second semiconductor material, the channel layers alternating the sacrificial layers. The pairs of fin structures are hence suitable for forming a transistor device in the form of a forksheet device. The above-mentioned method steps may hence in some embodiments be followed by further processing first and second layer stacks of at least a subset of the pairs of fin structures to form a first transistor device at the first device layer stack and a second transistor device at each second device layer stack, the processing comprising forming source and drain regions and forming gate stacks.

During such further processing, the insulating wall may confer aspects corresponding to those of the forksheet device, e.g. provide physical and electrical isolation between the transistor structures and the respective gate stacks. More specifically, the insulating wall may simplify gate stack patterning and enable a reduced sensitivity to mask edge placement errors (EPE) since the gate stacks may be self-aligned with the respective channels of the transistor structures. For a complementary transistor pair, this may offer further aspects during work function metal (WFM) fill and etch back in an RMG process. Furthermore, the insulating wall may reduce a risk of merging of the sources/drains of the transistor structures, e.g. during n- and n-type epitaxy.

Although the above discussion refers to the forksheet design and to PN separation, it is contemplated that the presently described methods may be applied favorably also to other device designs with closely spaced transistor structures of a same conductivity type (e.g. P- or N-type) which are based on stacks of channel layers separated by an insulating wall.

As the layer stack and the first and second device layer stacks in some embodiments may comprise additional sacrificial layers than those mentioned above, the above-mentioned sacrificial layers may also be referred to as "first sacrificial layers" if distinction need be made.

By the term "spacer lines" is hereby meant layers of a spacer material covering opposite side surfaces (i.e. vertically oriented side surfaces) of the core lines. Forming the spacer lines may comprise conformally depositing a spacer material layer and subsequently etching the spacer material layer such that discrete portions of the spacer material layer remain on the side surfaces of the core lines. The spacer material layer may in particular be etched using an anisotropic etching process (e.g. top-down). Portions of the spacer material layer deposited on horizontally oriented surfaces may be removed while portions of the spacer material layer deposited on the vertically oriented side surfaces of the core lines may be preserved to form the spacer lines.

By the term "conformal deposition" is hereby meant a deposition process resulting in a conformally growing layer or film. Conformal deposition may be achieved using an atomic layer deposition (ALD) process.

Relative spatial terms such as "top", "bottom", "upper", "lower", "vertical", "over", "above" are herein to be understood as denoting locations or directions within a frame of reference of the substrate. In particular, the terms may be understood in relation to a normal direction to the substrate on which the layer stack is formed, or equivalently in relation to a bottom-up direction of the layer stack. Correspondingly, terms such as "lateral" and "horizontal" are to be understood as locations or directions parallel to the substrate.

The core lines may extend along a first horizontal direction and be spaced apart along a second horizontal direction transverse to the first horizontal direction. Since the spacer lines are formed on the side surfaces of the core lines, this applies correspondingly to each one of: the spacer lines, the gaps, the first and second set of trenches, the insulating wall, and the fin structures of each pair of fin structures.

In some embodiments, the first trenches may be formed to extend into the substrate. Extending the first trenches into the substrate enables a corresponding extension of the insulating walls which among others may increase an electrical separation between the respective fin structures stacks of each pair. It may further facilitate subsequent processing steps by enabling a more mechanically stable support of the device layer stacks, such as during sacrificial layer removal.

In some embodiments, the second trenches may be formed to extend into the substrate. This enables an increased electrical separation between neighboring pairs of fin structures.

In some embodiments, the first trenches may be formed to extend to a first depth in the substrate and the second trenches may be formed to extend to a second depth in the substrate different from the first depth.

In some embodiments the method may further comprise forming a shallow trench isolation (STI) layer in the second trenches by depositing an insulating material in the second trenches and etching back the insulating material to a level below a bottom-most channel layer of each pair of fin structures. An STI-layer providing electrical isolation between the pairs of fin structures and allowing access to the channel layers for subsequent process steps may thus be formed.

In some embodiments, the insulating wall material may be conformally deposited and the method may further comprise exposing an upper surface of the core lines by subjecting the insulating wall material to a planarization and/or an etch back prior to removing the core lines. A conformal deposition enables deposition of high quality insulating material and void free filling of high-aspect ratio trenches.

In some embodiments, the first semiconductor material of the (first) sacrificial layers may be $Si_{1-y}Ge_y$ and the second semiconductor material of the channel layers may be $Si_{1-x}Ge_x$, wherein $0 \leq x < y$. This enables forming of Si-based transistor devices, the different Ge content facilitates a selective processing (e.g. etching) of the sacrificial layers and the channel layers.

In some embodiments, the layer stack may further comprise a bottom sacrificial layer of a third semiconductor material underneath the (first) sacrificial layers and the channel layers, and the method may further comprise, subsequent to forming the second trenches:

removing the bottom sacrificial layer of the first and second device layer stacks of each pair of fin structures by selective etching of the third semiconductor material, thereby forming a respective cavity in the first and second device layer stacks on opposite sides of the insulating wall; and depositing a bottom insulating material in the cavities, wherein during the acts of removing the bottom sacrificial layer and depositing the bottom insulating material, the (first) sacrificial layers and the channel layers of the first and second device layer stacks are supported by the respective insulating walls.

The bottom sacrificial layer of each device layer stack underneath the (first) sacrificial layers and the channel layers may thus be "replaced" by a bottom insulating layer of the bottom insulating material for electrically insulating the channel layers from the substrate.

By the layer stack further comprising the bottom sacrificial layer, the first and second device layer stacks of each pair of fin structures may comprise a bottom sacrificial layer of the third semiconductor material. As may be appreciated, the first trenches and the second trenches may each be formed to extend through also the bottom sacrificial layer.

In horizontal channel transistor structures (e.g. the NWFET, the NSHFET and the forksheet), an electrical insulation, e.g. a "bottom insulation" may be needed to mitigate charge carrier leakage from e.g. the source, the drain or the channel into the underlying semiconductor substrate. Existing processing techniques may however be relatively complex and be challenging to apply at more aggressive device dimensions.

Since the replacement process may be performed prior to source/drain region and gate stack formation, the bottom insulating layers may extend uninterrupted underneath the source, drain, and channel regions. Moreover, the method is compatible with source/drain and gate stack formation processes conventionally used in advanced technology nodes, such as source/drain epitaxy and replacement metal gate (RMG) processes. A related aspect is that each one of the bottom insulating layers may extend uninterrupted underneath a plurality of pairs of first and second transistor structures formed along the insulating wall.

The replacement process is facilitated by the insulating wall which extends into the underlying semiconductor layer of the substrate. Thus, a height of the insulating wall (and correspondingly a depth of the trench) may exceed height of the layer stacks above (an upper surface of) the semiconductor layer of the substrate. A base portion of the insulating wall may thus be anchored in the underlying semiconductor layer. The insulating wall may hence act as a supporting structure for the remaining layers of the layer stacks (e.g. the channel layers) when the sacrificial layer is removed. The remaining layers may accordingly be suspended above the cavities by the insulating wall.

In some embodiments, the bottom insulating material may be conformally deposited with a thickness such that the cavities are filled with the bottom insulating material, and the method may further comprise removing the bottom insulating material from each first and second device layer stack above a level of the cavities.

A conformal deposition enables bottom insulating material to be deposited within the cavities "from the sides". The deposition may be stopped when or after the cavities are closed or "pinched-off" by the bottom insulating material.

In some embodiments, a bottom-most one of the sacrificial layers may be formed on (i.e. directly on/in abutment with) the bottom sacrificial layer.

Hence, the bottom-most channel layer of each first and second layer stack may be separated from the bottom sacrificial layer (and after the replacement from the bottom insulating material) by a first sacrificial layer. This allows a space may be formed also underneath the bottom-most channel layer in each device layer stack during subsequent device processing steps, e.g. by removing the first sacrificial layers during channel release. This makes it possible for the gate stacks to be formed along three sides of the bottom-most channel layer.

In some embodiments the first semiconductor material of the (first) sacrificial layers may be $Si_{1-y}Ge_y$, the second semiconductor material of the channel layers may be $Si_{1-x}Ge_x$, and the third semiconductor material of the bottom sacrificial layer may be $Si_{1-z}Ge_z$, wherein $0 \le x < y < z$. This enables forming of Si-based transistor devices, the different Ge content facilitates a selective processing (e.g. etching) of the first sacrificial layers, the bottom sacrificial layer and the channel layers.

As noted above, the method may in some embodiments comprise further processing first and second layer stacks of at least a subset of the pairs of fin structures. Such processing may in some embodiments further comprise, for each of the at least a subset of the pairs fin structures:

- forming a sacrificial gate structure extending across the pair of fin structures and the insulating walls;
- etching through the first and second device layer stacks of the pair of fin structures while using the sacrificial gate structure as an etch mask such that portions of sacrificial and channel layers of the first and second device layer stack are preserved underneath the sacrificial gate structure,
- forming source and drain regions by epitaxially growing semiconductor material on end surfaces of the respective channel layers of the first and second device layer stacks, at opposite sides of the sacrificial gate structure;
- subsequently, removing the sacrificial gate body and thereafter removing the sacrificial layers of the first and second device layer stacks by selectively etching the first sacrificial semiconductor material; and
- subsequently forming a gate stack on the channel layers of the first and second device layer stacks.

In embodiments comprising replacing a bottom sacrificial layer with bottom insulating material, the bottom insulating material may subsequent to this further processing form a bottom insulating layer underneath the source region, the drain region and the channels on either side of the insulating wall.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

In the following, and with reference to FIGS. 1-16, embodiments of a method for forming a semiconductor device structure will be described. It is noted that the method to be described is related to a specific part of a method for forming a semiconductor device structure. However, the method may comprise preceding steps such as preparing the substrate and subsequent steps of processing the semiconductor device structure to form transistor devices, e.g. comprising forming a source/drain formation and gate stack deposition etc.

Figure 1:
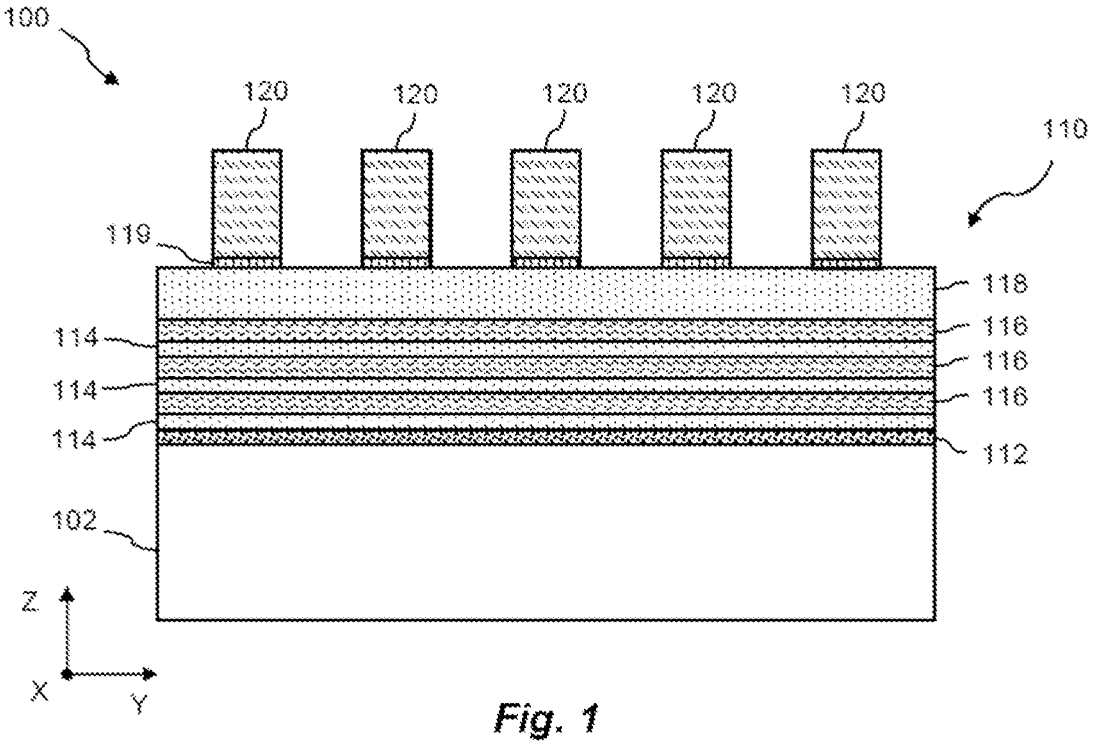
FIG. 1 illustrates a method for forming a semiconductor device structure, according to some embodiments.

FIG. 1 depicts a semiconductor device structure 100 at an initial stage of the method.

Axes X, Y and Z indicate a first horizontal direction, a second horizontal direction transverse to the first direction, and a vertical or bottom-up direction, respectively. The X- and Y-direction may in particular be referred to as lateral or horizontal directions in that they are parallel to a main plane of a substrate 102. The Z-direction is parallel to a normal direction to the substrate 102.

FIG. 1 depicts a cross-sectional view of the structure 100 taken along the YZ plane. The cross-sectional views of the subsequent figures correspond to those in FIG. 1 unless stated otherwise.

The structure 100 comprises a substrate 102. The substrate 102 may be a conventional semiconductor substrate suitable for CMOS device processing. The substrate 102 may be a single-layered semiconductor substrate, for instance formed by a bulk substrate such as a Si substrate, a germanium (Ge) substrate or a silicon-germanium (SiGe) substrate. A multi-layered/composite substrate is however also possible, such as an epitaxially grown semiconductor layer on a bulk substrate, or a semiconductor-on-insulator (SOI) substrate, such as a Si-on-insulator substrate, a Ge-on-insulator substrate, or a SiGe-on-insulator substrate.

In FIG. 1 a layer stack 110 has been formed on the substrate 102. The layer stack 110 comprises first sacrificial layers 114 of a first semiconductor material and channel layers 116 of a second semiconductor material. The channel layers 116 are arranged alternatingly with the first sacrificial layers 114.

The layer stack 110 may as shown further comprise a bottom sacrificial layer 112 of a third semiconductor material underneath the first sacrificial layers 114 and the channel layers 116. As will be further described below, presence of a bottom sacrificial layer 112 may facilitate forming of a bottom insulating layer underneath the first sacrificial layers 114 and the channel layers 116. However, bottom isolation may also be provided in other ways, such as by an insulating layer of a SOI-substrate, and may hence be omitted. In embodiments comprising the bottom sacrificial layer 112, a bottom-most one of the sacrificial first layers 114 may be formed on the bottom sacrificial layer 112.

For example, the first and second semiconductor materials may be $Si_{1-y}Ge_y$ and $Si_{1-x}Ge_x$ respectively. The third semiconductor material (if present in the layer stack 110) may be $Si_{1-z}Ge_z$, wherein $0 \leq x<y<z$. In a more specific example, the second semiconductor material may be a Si, the first semiconductor material may be $SiGe_{0.25}$, and the third semiconductor material may be $SiGe_{0.5}$ or $SiGe_{0.65}$. These relative differences in Ge-content facilitate a selective processing (e.g. selective etching) of the different sacrificial layers and the channel layers of the layer stack 110. For example, a SiGe layer with a greater concentration of Ge than another Si or SiGe layer may be etched selectively (i.e. at a greater rate) using an HCl-based dry etch may be used. A further example is ammonia peroxide mixture (APM). However, other appropriate etching processes (wet or dry) allowing selective etching of higher Ge-content SiGe layers with respect to lower Ge-content SiGe (or Si) layers are per se known in the art and may also be employed for this purpose.

The layers of the device layer stack 110 may each be epitaxial layers, e.g. epitaxially grown using deposition techniques which per se are known, such as chemical vapor deposition (CVD) or physical vapor deposition (PVD). This enables high quality material layers with a potential degree of control of composition and dimensions.

The first sacrificial layers 114 (and also the bottom sacrificial layer 112 if present) may be of a uniform thickness. Correspondingly, the channel layers 116 may be of a uniform thickness. The first sacrificial layers 114 may for example have a thickness of 5-15 nm, such as 7 nm. The channel layers may for example have a thickness of 5-15 nm, such as 10 nm.

The layer stack 110 may as shown further optionally comprise a top sacrificial layer 118 of the first semiconductor material. The top sacrificial layer 118 may be formed with a greater thickness than each one of the first sacrificial layers 114. As may be understood from the following, this may facilitate forming the insulating wall with an increased height above a top-most channel layer.

As further shown in FIG. 1, a plurality of parallel and regularly spaced core lines 120 have been formed on the layer stack 110. The core lines 120 extend in the X-direction. The core lines 120 are spaced apart along the Y-direction. The core lines 120 may be formed of a hard mask material, e.g. a nitride material such as SiN, SiCN, SiON, SiCON or SiBCN. The core lines 120 may be formed by depositing the hard mask material over the layer stack 110. The hard mask material may subsequently be patterned to form the pattern of regularly and parallel spaced core lines 120. Examples of patterning techniques include single patterning techniques such as lithography and etching ("litho-etch") or multiple-patterning techniques such as (litho-etch)', self-aligned double or quadruple patterning (SADP or SAQP). Prior to depositing the hard mask material layer, an etch stop layer (e.g. of a dielectric hard mask material different from the material of the core lines 120) may optionally be deposited on the layer stack 110 wherein the hard mask material layer may be deposited on the etch stop layer. An etch stop layer between the hard mask material layer and the layer stack 110 may serve as protection for the layer stack 110 during the core line patterning. Each core line 120 may accordingly as shown be formed on a respective etch stop layer portion 119.

Figure 2:
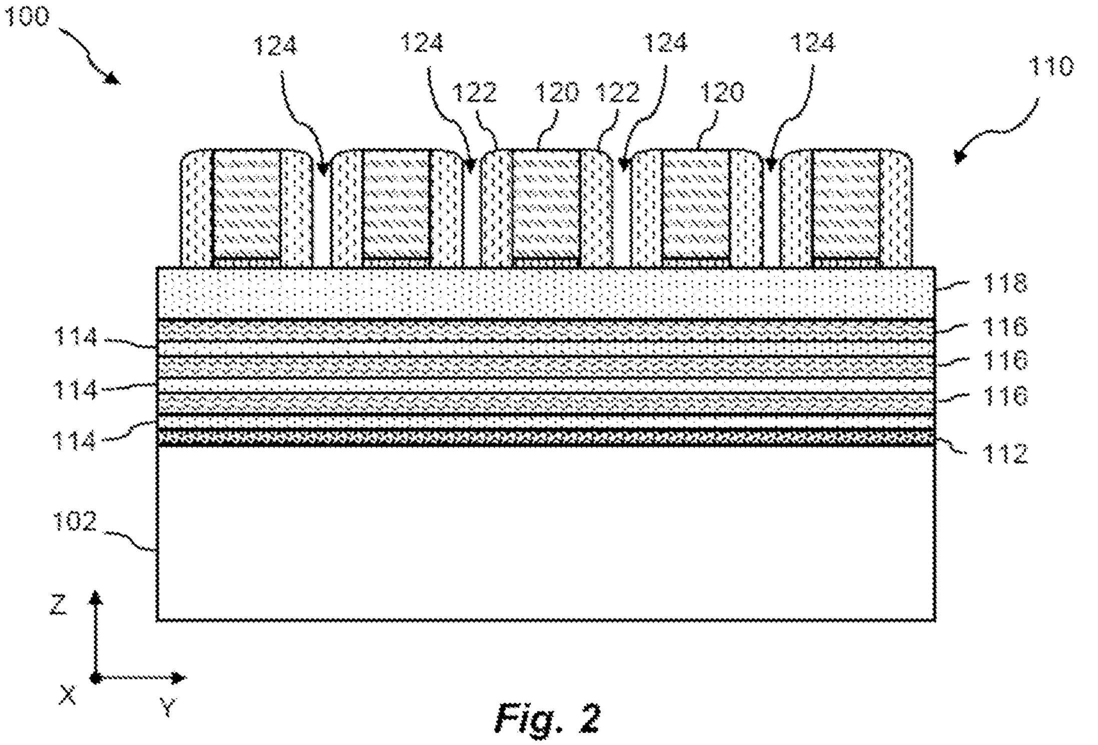
FIG. 2 illustrates a method for forming a semiconductor device structure, according to some embodiments.

In FIG. 2, spacer lines 122 have been formed on each core line 120. A respective pair of spacer lines 122 has been formed on and along the opposite and vertically oriented side surfaces of each core line 120. The spacer lines 122 are formed with a width (along the Y-direction) such that longitudinal first gaps 124 (extending along the X-direction) are formed between spacer lines 122 formed on neighboring (i.e. consecutive) core lines 120.

As will be apparent from the below, a width of the spacer lines 122 defines the width of the channel layers 116 of the device layer stacks of the pairs of fin structures to be formed. Meanwhile, a width of the first gaps 124 (e.g. along the Y-direction) defines the width of the respective insulating wall between each pair of fin structures to be formed. The insulating wall may for example be formed with a width in a range from 8-20 nm.

The spacer lines 122 may be formed by conformally depositing a spacer material over the layer stack 110 and the core lines 120, and subsequently etching the spacer material using a top-down anisotropic etching process, such that portions of the spacer material remains on the side surfaces of the core lines 120 to define the spacer lines 122, and upper surface portions of the layer stack 110 are exposed between the spacer lines 122 (i.e. in the first gaps 124). The spacer lines 122 may be formed of a dielectric material, different from a material of the core lines 120. The spacer lines 122 may for example be formed of an oxide, such as $SiO_2$ deposited using ALD. However other materials are also possible such as any of the material examples listed in connection with the core lines 120, provided the material has a sufficient etch contrast to the material of the core lines 120.

Figure 3:
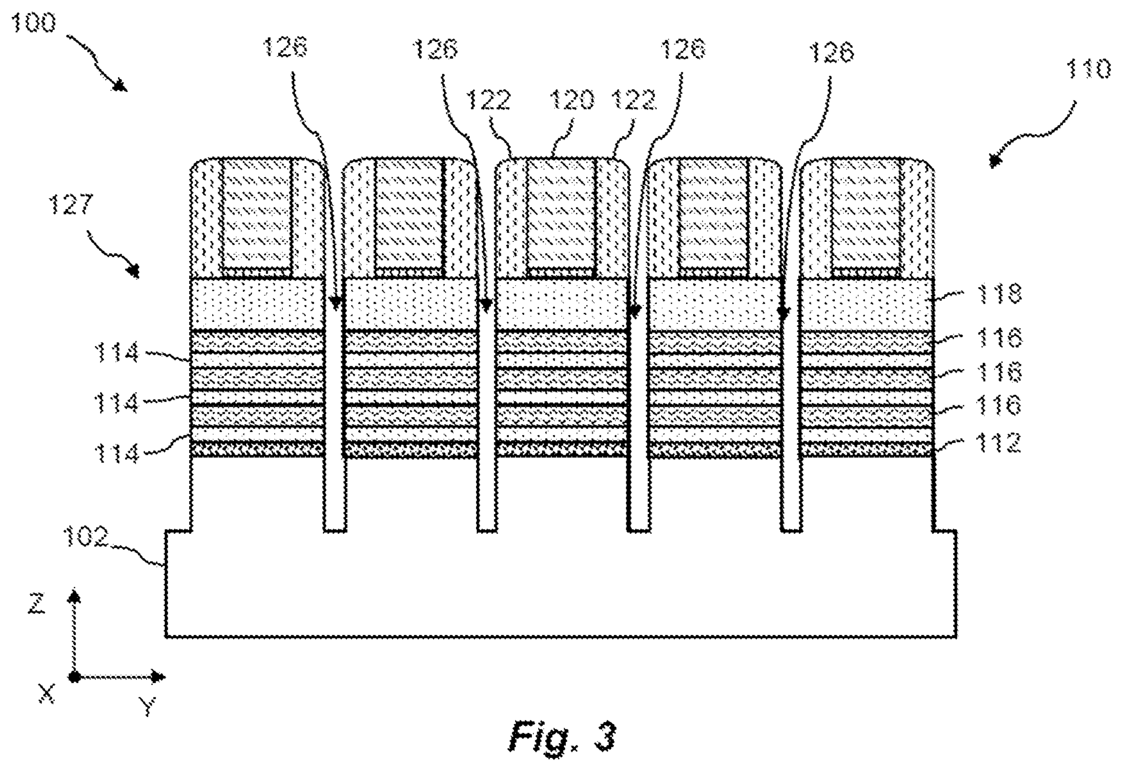
FIG. 3 illustrates a method for forming a semiconductor device structure, according to some embodiments.

In FIG. 3, first trenches 126 extending through the layer stack 110 have been formed by etching the layer stack 110 while using the core lines 120 and the spacer lines 122 as an etch mask. The pattern defined the first gaps 124 has accordingly been transferred into the layer stack 110 by etching to form the first trenches 126. The first trenches 126 may be etched using e.g. a top-down anisotropic etching process. The first trenches 126 may as shown be formed to extend into a thickness portion of the substrate 102, e.g. to a first depth in the substrate 102. Extending the first trenches 126 into the substrate 102 allows a base portion of the insulating wall 128 to be formed to be embedded in the substrate 102. This may confer an increased structural stability mitigating a risk of collapse of the fin structures 140 to be formed. The first trenches 126 may for example extend 20-50 nm into the substrate 102, i.e. below the bottom sacrificial layers 112.

Figure 4:
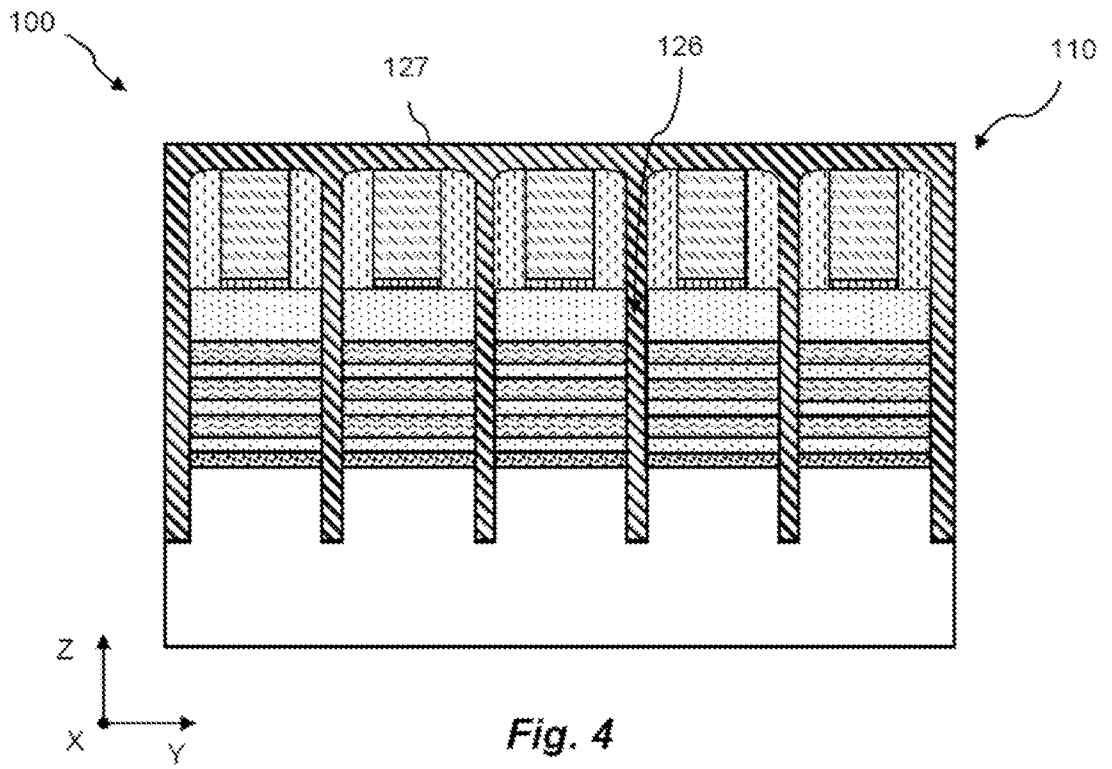
FIG. 4 illustrates a method for forming a semiconductor device structure, according to some embodiments.
Figure 5:
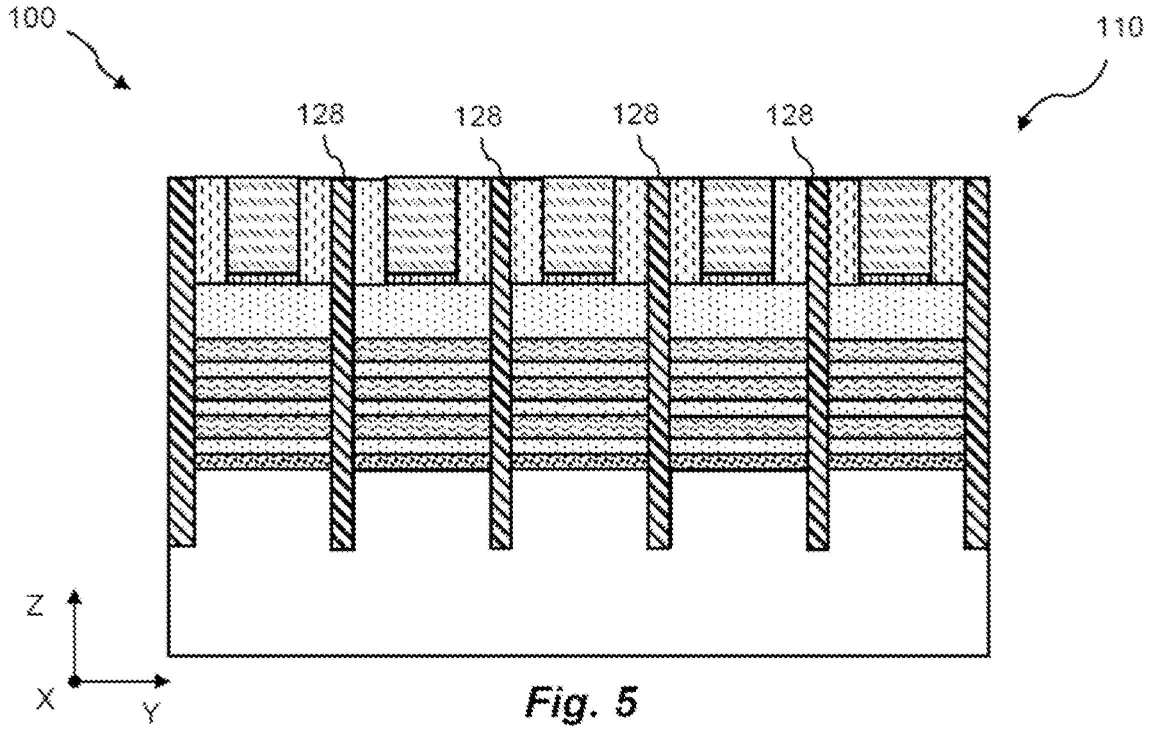
FIG. 5 illustrates a method for forming a semiconductor device structure, according to some embodiments.

FIGS. 4-5 depict process steps for forming insulating walls 128 in the first trenches 126 and in the gaps 124.

In FIG. 4, the first trenches 126 and the gaps 124 have been filled with an insulating wall material 127. The insulating wall material 127 may be conformally deposited to fill the first trenches 126 and cover the core lines 120 and the spacer lines 122.

In FIG. 5, the insulating wall material 127 has been subjected to a planarization (e.g. chemical mechanical polishing, CMP) and/or an etch back (isotropic or anisotropic, wet or dry) to expose an upper surface of the core lines 120 and the spacer lines 122. The insulating wall material 127 has thus been separated into discrete respective insulating walls 128 in the first trenches 126 and the first gaps 124. The processing may as shown also result in a slight recess of the core lines 120 and the spacer lines 122, such that the device structure 100 may be provided with a planar upper surface.

The insulating wall material 127 may for example be an oxide, a nitride or carbide material, such as such as SiN, SiCO, SiCN or SiOCN deposited e.g. by ALD. It is however also possible to deposit the insulating wall material 127 using non-conformal deposition processes such as chemical vapor deposition (CVD) and flowable dielectric deposition. The insulating wall material 127 may in any case be different from a material of the core lines 120 and a material of the spacer lines 122, as well as of the etch stop layer portions 119 if present.

Figure 6:
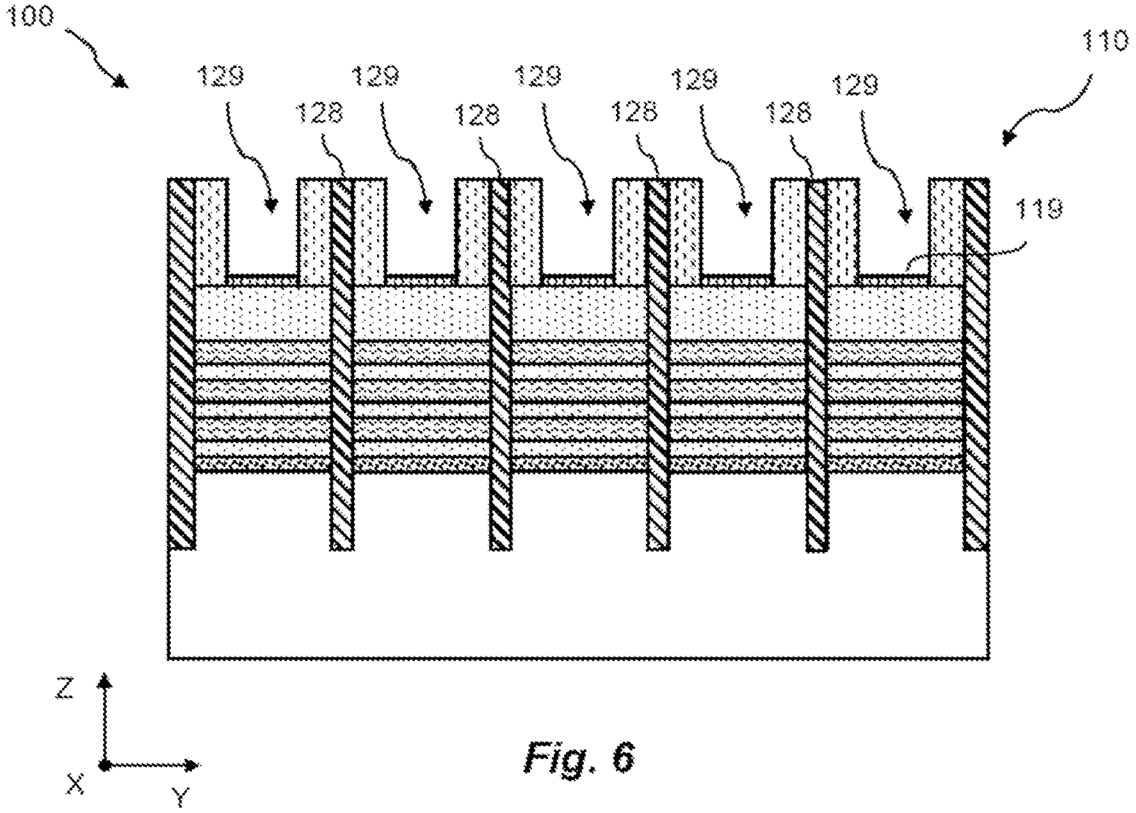
FIG. 6 illustrates a method for forming a semiconductor device structure, according to some embodiments.

In FIG. 6, subsequent to forming the insulating walls 128, the core lines 120 have been removed selectively to the spacer lines 122 and the insulating walls 128. Any sufficiently selective etching process may be used, isotropic or anisotropic, wet or dry. By removing the core lines 120, second gaps 129 are formed between pairs of spacer lines 122. In the illustrated example, the core lines 120 have been removed selectively to, and thus stopped on, the etch stop layer portions 119, which remain to mask the layer stack 110.

Figure 7:
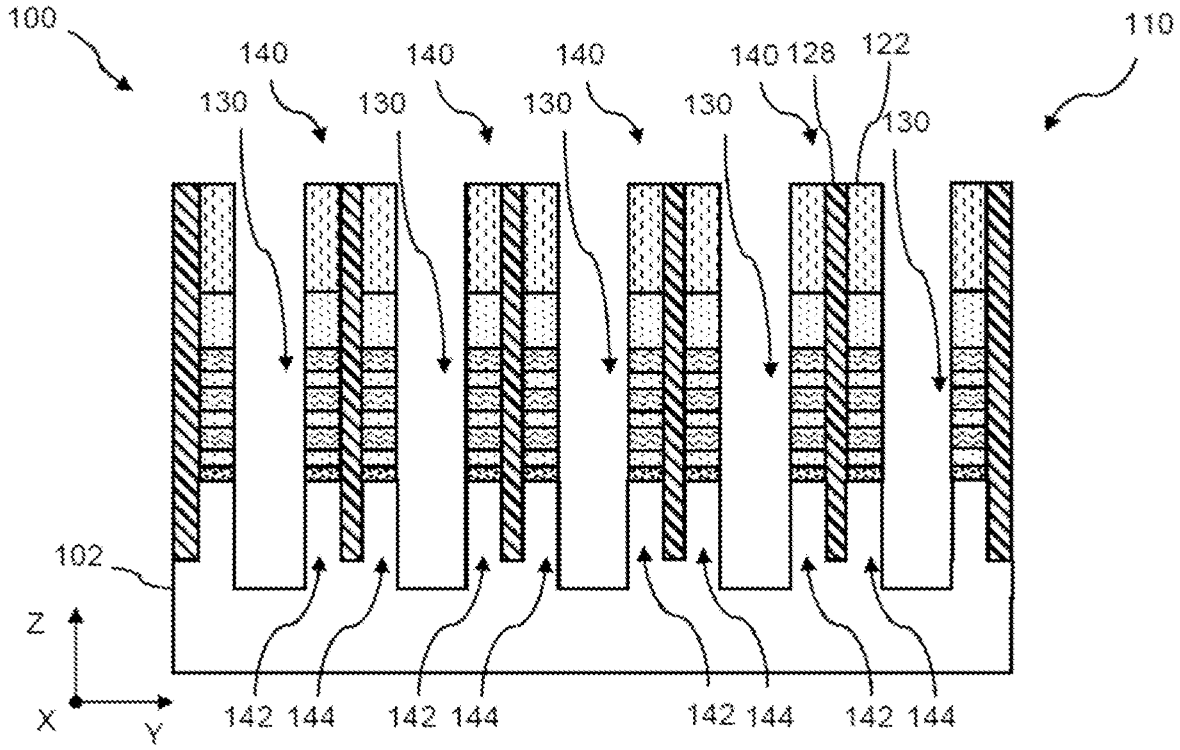
FIG. 7 illustrates a method for forming a semiconductor device structure, according to some embodiments.

In FIG. 7, subsequent to removing the core lines 120 (and then the etch stop layer portions 119 if present), second trenches 130 extending through the layer stack 110 have been formed by etching the layer stack 110 while using the spacer lines 122 and the insulating walls 128 as an etch mask. The pattern defined by the second gaps 129 has accordingly been transferred into the layer stack 110 by etching to form the second trenches 130. Accordingly, as shown, a plurality of pairs of fin structures 140 have been formed. Each pair of fin structures 140 comprises a respective fin-shaped first and second device layer stack 142, 144. The first and second device layer stacks 142, 144 of each pair of fin structures 140 are separated by a respective insulating wall 128. Spacer lines 122 (or at least portions thereof remaining after the planarization and/or etch back) may remain as a capping on each first and second device layer stack 142, 144. The second trenches 130 may be etched using a top-down anisotropic etching process. The second trenches 130 may as shown be formed to extend into a thickness portion of the substrate 102, e.g. to a second depth in the substrate 102. The second depth may as shown be greater than the first depth of the first trenches 126. The second trenches 130 may for example extend 40-70 nm into the substrate 102, i.e. below the bottom sacrificial layers 112.

Figure 8:
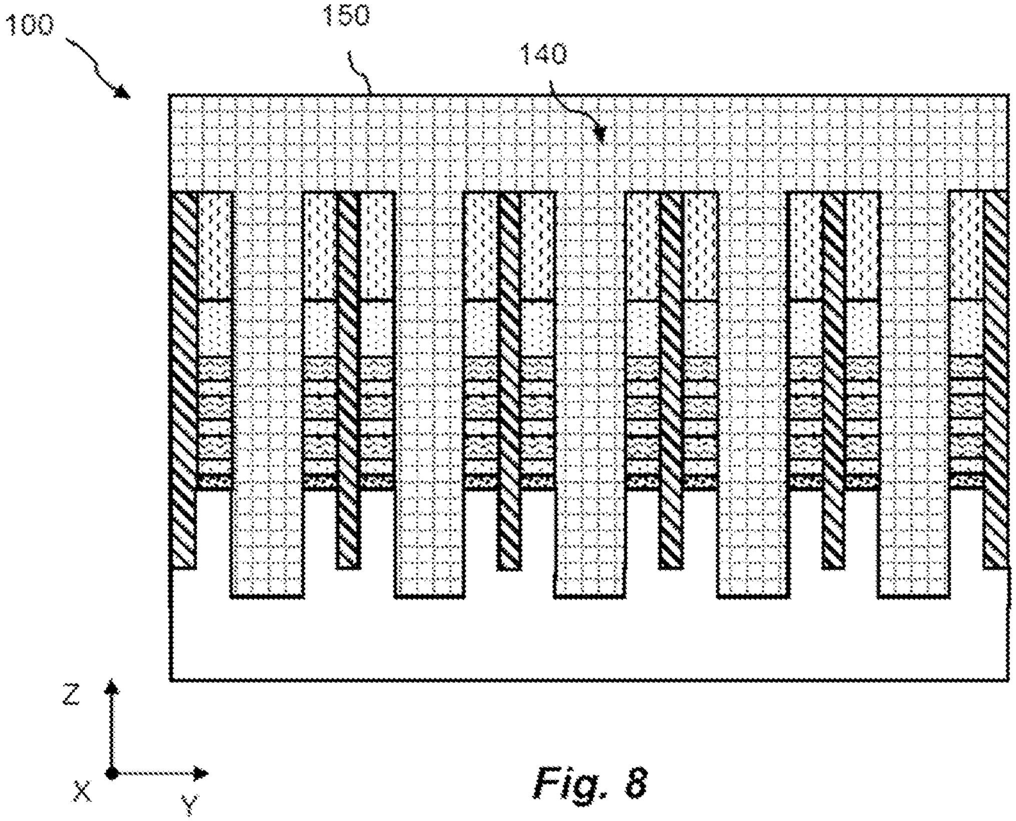
FIG. 8 illustrates a method for forming a semiconductor device structure, according to some embodiments.
Figure 9:
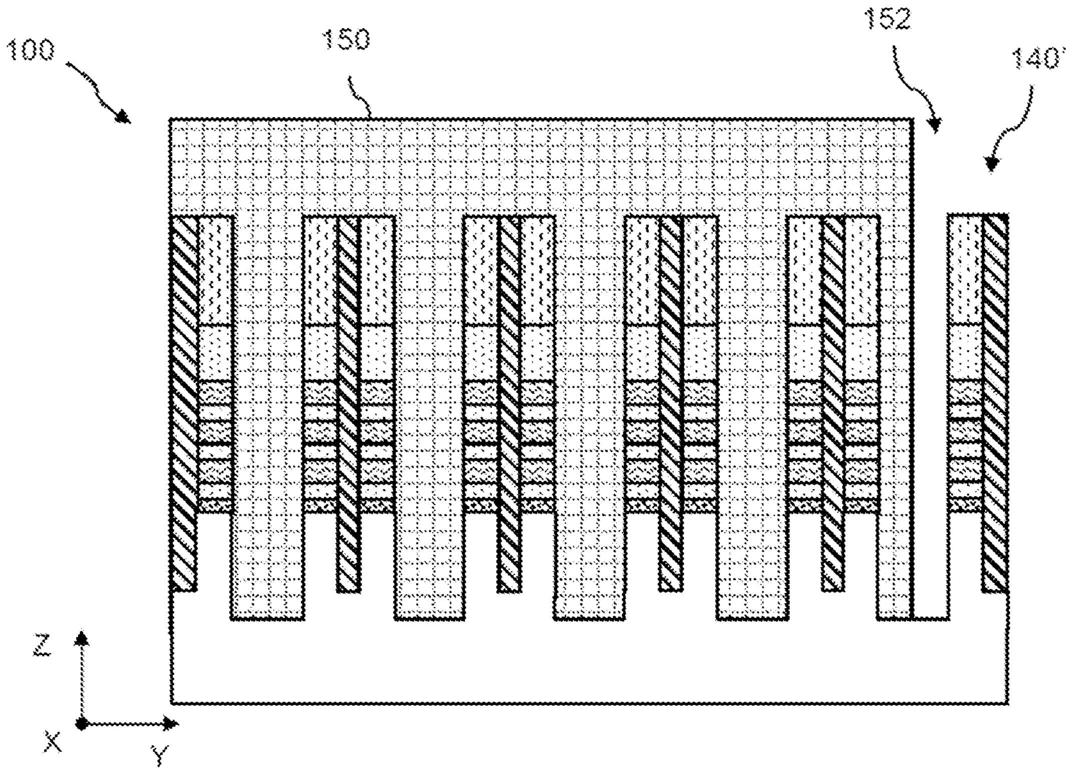
FIG. 9 illustrates a method for forming a semiconductor device structure, according to some embodiments.
Figure 10:
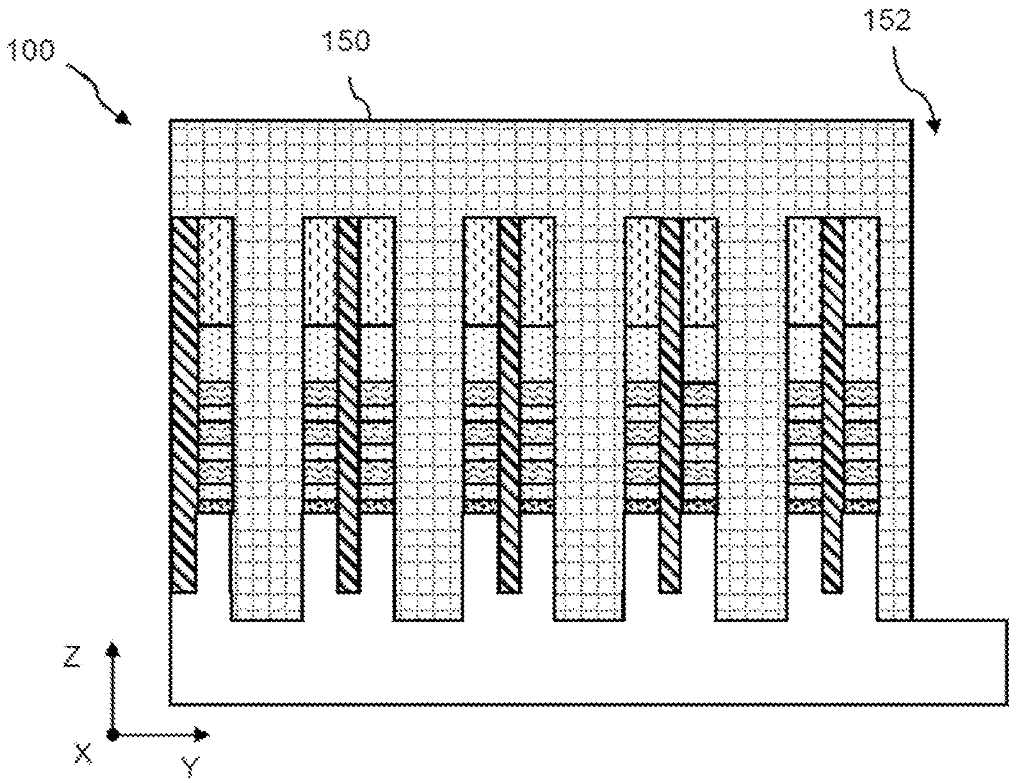
FIG. 10 illustrates a method for forming a semiconductor device structure, according to some embodiments.

FIGS. 8-10 depict optional process steps for removing selected ones of the plurality of pairs of fin structures 140. These process steps may be applied to introduce an increased spacing between neighboring pairs of fin structures 140 in desired regions of the substrate 102.

In FIG. 8, a masking layer 150 has been deposited to cover the pairs of fin structures 140 and fill the second trenches 130. The masking layer 150 may for instance comprise a planarizing layer of spin-on-carbon or another organic spin-on material. Although depicted as a single layer, the masking layer 150 may typically be formed as a mask layer stack, comprising e.g. a hard mask layer and a photoresist layer.

In FIG. 9, the masking layer 150 has been patterned to define an opening 152 exposing one or more of the pairs of fin structures 140, in FIG. 9 exemplified by the partially shown pair 140'. The opening 152 may be formed by lithography and etching.

In FIG. 10, pairs of fin structures 140 not masked by the masking layer 150 have been removed by etching. Due to the multiple different materials of the fin structures 140, the spacer lines 122 and the insulating wall 128, multiple different etching steps and etching chemistries may be employed.

Figure 11:
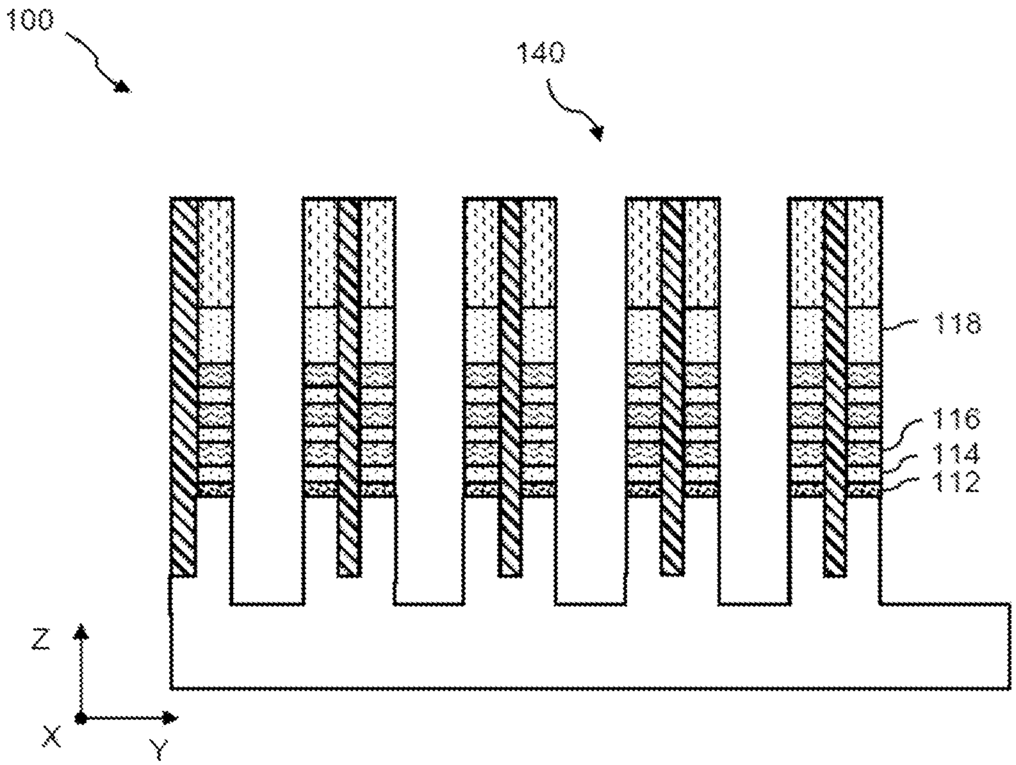
FIG. 11 illustrates a method for forming a semiconductor device structure, according to some embodiments.

In FIG. 11, the masking layer 150 has been removed from the remaining pairs of fin structures 140.

Figure 12:
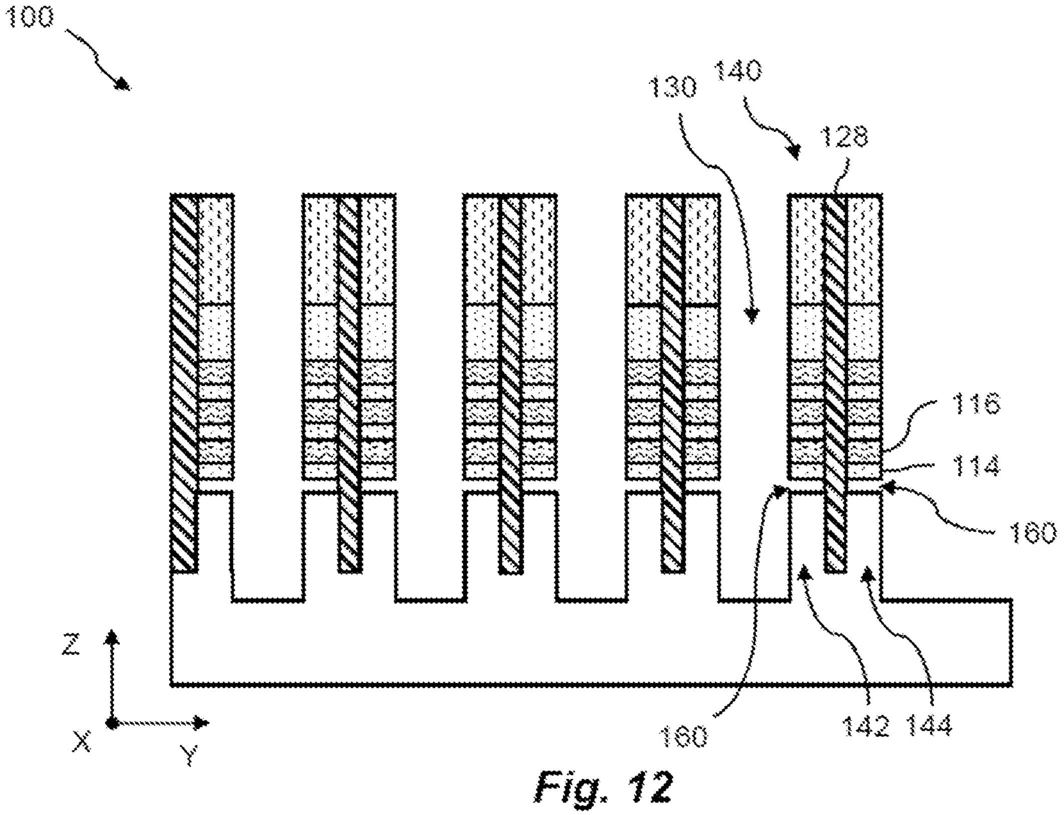
FIG. 12 illustrates a method for forming a semiconductor device structure, according to some embodiments.
Figure 13:
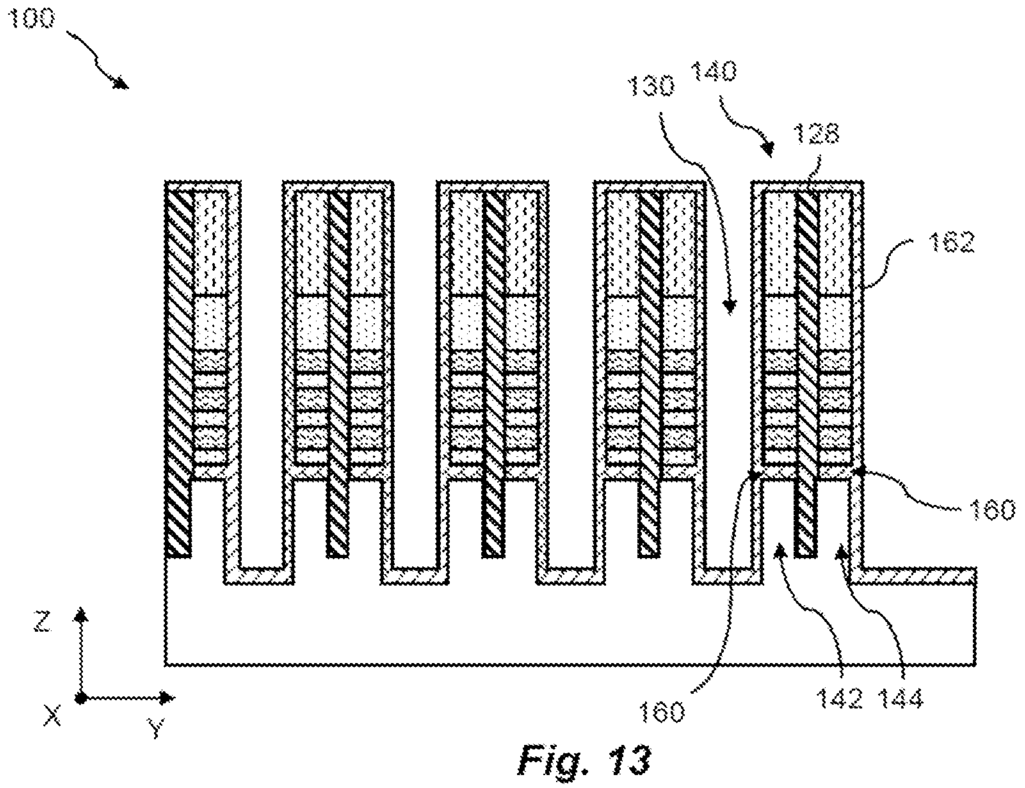
FIG. 13 illustrates a method for forming a semiconductor device structure, according to some embodiments.
Figure 14:
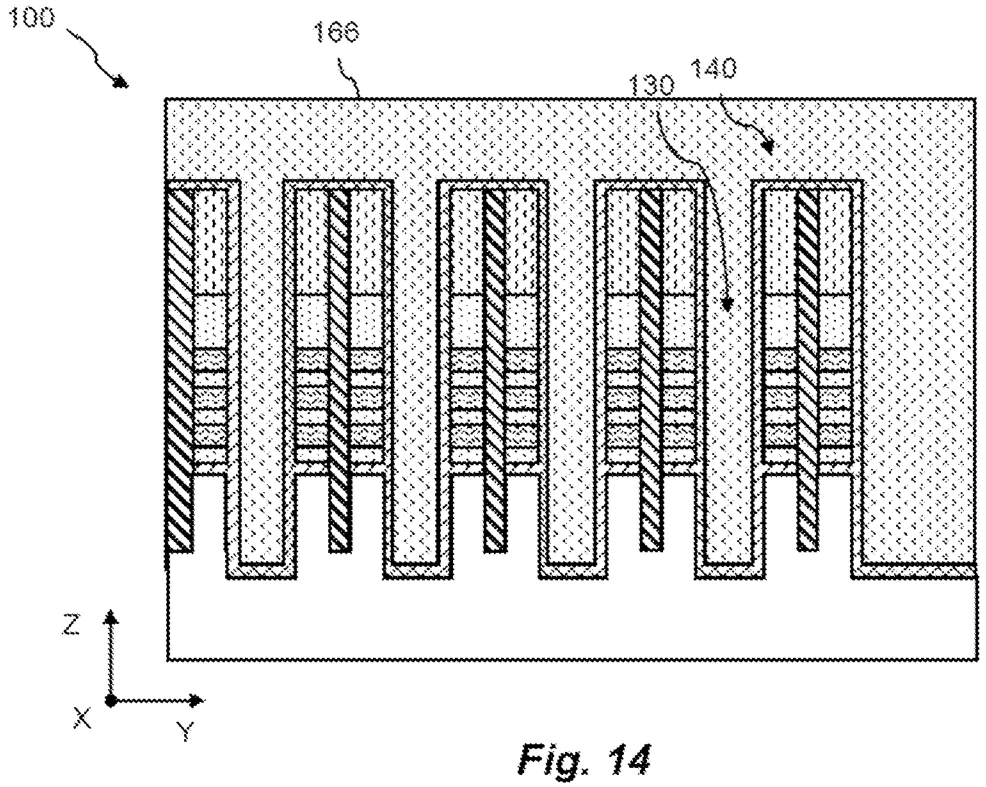
FIG. 14 illustrates a method for forming a semiconductor device structure, according to some embodiments.

FIGS. 12-14 depict process steps for forming a bottom insulating layer 164 in each first and second layer stack 142, 144 of the pairs of fin structures 140.

In FIG. 12, the bottom sacrificial layer 112 of the first and second device layer stacks 142, 144 of each pair of fin structures 140 has been removed by selective etching of the third semiconductor material. A respective cavity 160 has thereby been formed in the first and second device layer stacks 142, 144, on opposite sides of the insulating wall 128. Any of above listed example etching processes facilitating a selective etching of e.g. $Si_{1-z}Ge_z$ to $SiGe_{1-x}Ge_x$ and $SiGe_{1-y}Ge_y$, $(0 \leq x < y < z)$ may be employed. As may be appreciated, that the bottom sacrificial layer 112 may be removed along the entire longitudinal dimension of the pairs of fin structures 140, such that the respective cavities 160 may be coextensive with the fin structures 140, i.e. the remaining parts of the first and second device layer stacks 142, 144.

In FIG. 13, a bottom insulating material 162 has been deposited in the cavities 160. The bottom insulating material may as shown be conformally deposited over the pairs of fin structures 140 with a thickness such that the cavities 160 are filled with the bottom insulating material 162. The bottom insulating material 162 may for example be selected among the examples mentioned for the insulating wall material. The portion of the bottom insulating material 162 filling a respective cavity 160 may define a bottom insulating layer 164 in the cavity 160.

During the removal of the bottom sacrificial layers 112 and the subsequent deposition of the bottom insulating material 162, the first and second device layer stacks 142, 144 may be supported by the respective insulating walls 128, such that they are suspended above the respective cavities 160 until filled with the bottom insulating material 162.

In FIG. 14, an initial STI layer 166 has been formed by depositing a (second) insulating material to fill the second trenches 130. The initial STI layer 166 may accordingly as shown cover and embed the pairs of fin structures 140. The insulating material may be an oxide, such as silicon oxide deposited e.g. by CVD, for example by flowable CVD (FCVD) or another conventional inter-layer dielectric material suitable as STI.

Figure 15:
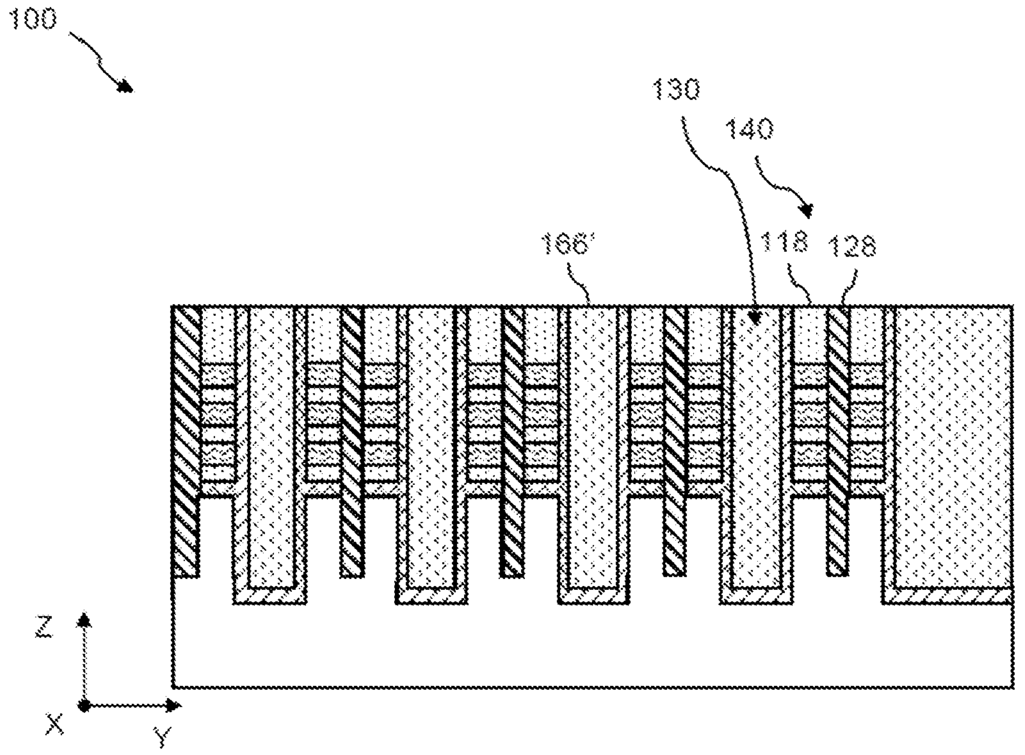
FIG. 15 illustrates a method for forming a semiconductor device structure, according to some embodiments.

In FIG. 15, a recess process (top-down), e.g. comprising planarization (such as CMP) and/or etch back, has been applied to the initial STI layer 166 to define a partly recessed STI layer 166'. The recess may as shown proceed to remove also the spacer lines 122 and thus expose a layer of the first and second device layer stacks 142, 144. In the illustrated embodiment the thicker top sacrificial layer 118 is exposed. However, the exposed layer may also be a top-most first sacrificial layer 114 or a top-most channel layer 116, in embodiments not comprising the top sacrificial layer 118.

Figure 16:
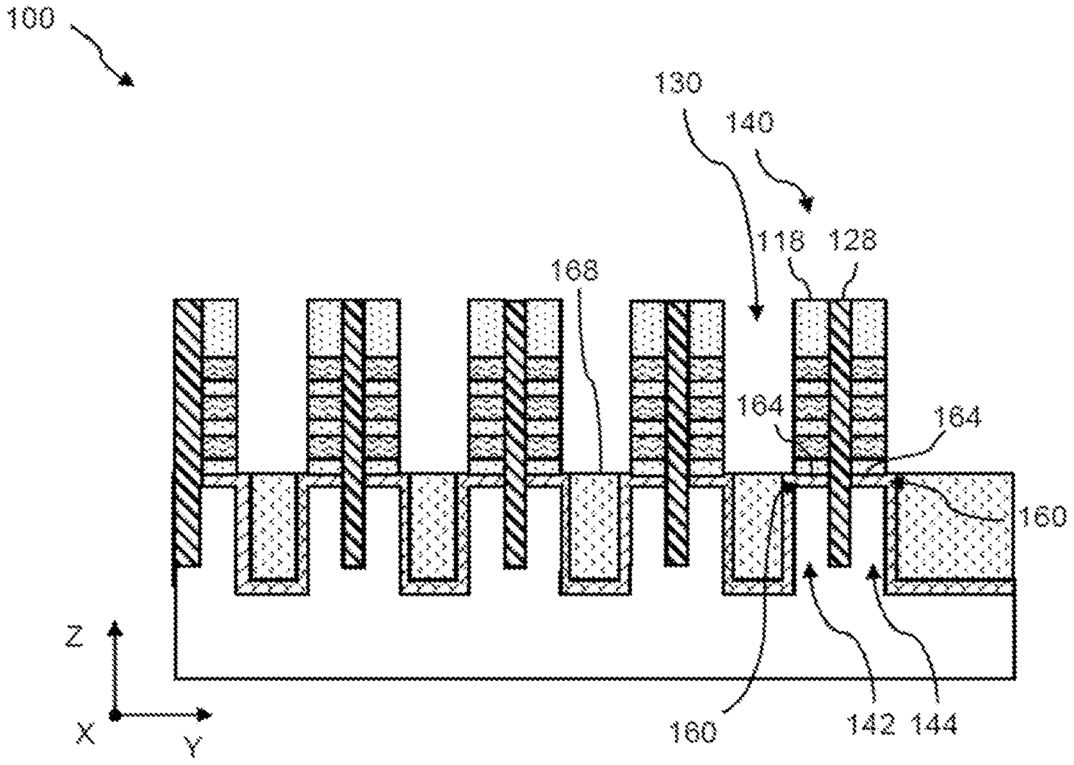
FIG. 16 illustrates a method for forming a semiconductor device structure, according to some embodiments.

In FIG. 16, a final STI layer 168 has been formed by further recessing (e.g. etching back) the partly recessed STI layer 166' in the second trenches 130. The final STI-layer 168 may hence fill a bottom part of the second trenches 130 and embed a base portion of each pair of fin structures 140. Depending on an etch contrast between the bottom insulating material 162 and the insulating material of the STI-layer 168, the recessing may simultaneously remove portions of the bottom insulating material 162 such that the first and second layer stacks 142, 144 are exposed at a level above an upper surface of the STI layer 168. However, portions of the bottom insulating material 162 may also be removed in a separate etch step (e.g. isotropic) after defining the final STI layer 168.

In FIG. 16, the recessing has been stopped slightly above a level of the cavities 160 and the bottom insulating layers 164 therein. More specifically the recessing has been stopped at a level coinciding with a level of the bottom-most first sacrificial layer 114. This however merely represents an example and it is also possible to proceed further with the etch back, e.g. to a level falling within or below the cavities 160, as the layers of the first and second device layer stacks 142, 144 of the pairs of fin structures 140 remaining above the cavities 160 may mask the bottom insulating material 162 deposited in the cavities 160. In any case the recessing may proceed to a level below a bottom-most channel layer 116 to allow the bottom-most channel layer 116 to be accessed by subsequent processing steps.

The resulting semiconductor device structure 100 shown in FIG. 16, comprising the plurality of pairs of fin structures 140 surrounded by the STI-layer 168 may as discussed be a suitable precursor for subsequent device fabrication, e.g. to form forksheet devices.

Figure 17:
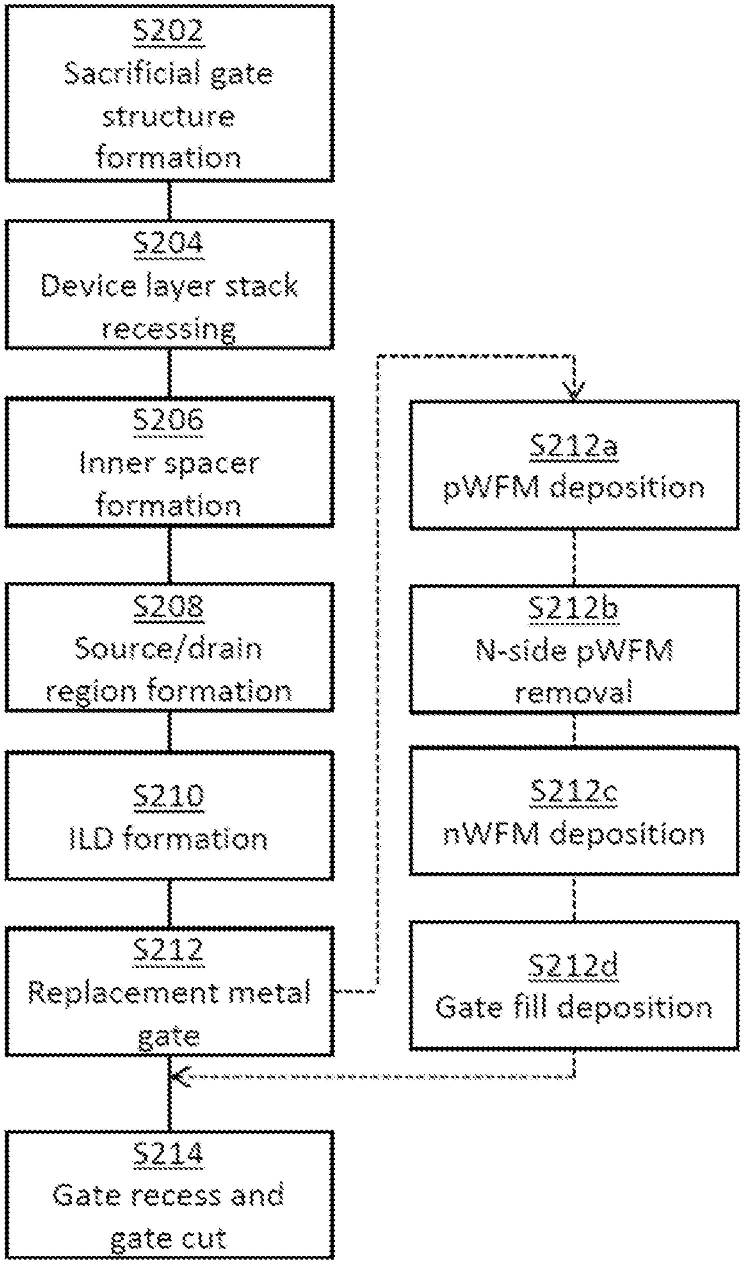
FIG. 17 is a flow-chart of a method for forming transistor devices, according to some embodiments.

FIG. 17 is a flow chart of an example process flow which may be applied to the pairs of fin structures 140 to form a semiconductor device structure comprising a pair of closely spaced FETs of complementary conductivity types in accordance with the forksheet design. The processing steps may be applied to each of the pairs of fin structures 140 shown in FIG. 16 or only a subset thereof.

In step S502, a number of sacrificial gate structures may be formed across the pairs of fin-structures 140 and the (respective) insulating walls 128. Each sacrificial gate structure may comprise a sacrificial gate body (e.g. of amorphous Si) and a pair of gate spacers on opposite sides of the sacrificial gate body. The sacrificial gate structures may be formed using conventional processing techniques as per se are known in the art.

In step S204, the first and second device layer stack 142, 144 of each pair of fin structures 140 may be recessed (e.g. etched back top-down) using the (respective) sacrificial gate structure as an etch mask, such that portions of sacrificial 114 (and 118) and channel layers 116 of each first and second device layer stack 142, 144 are preserved underneath the sacrificial gate structure.

In step S206, inner spacers may be formed at opposite sides of each device layer stack 142, 144. Inner spacers may be formed in a manner which per se is known in the art of NWFETs/NSHFETs. For example, inner spacer cavity formation may proceed by: forming recesses in each device layer stack 142, 144 by an isotropic etching process selective to the first semiconductor material; a conformal spacer material deposition (e.g. SiN, SiCO deposited by ALD-dielectric); followed by etching of the spacer material such that spacer material remains only in the recesses to form the inner spacers.

In step S208, source/drain regions may be formed on end surfaces of the channel layers 116 of each device layer stack 142, 144, at opposite sides of the respective sacrificial gate structures. The source/drain regions may for example be formed by selective area Si epitaxy. Techniques such as in-situ doping and/or ion implantation may be used to define n-type and p-type source/drain regions. Source/drain regions of p-type and source/drain regions of n-type may be formed sequentially on opposite sides of each insulating wall 128 by masking the device layer stack (e.g. 142 or 144) at the opposite side of the insulating wall 128. The insulating walls 128 may facilitate separation between the p- and n-type source/drain regions.

In step S210, one or more inter-layer dielectric (ILD) materials may be deposited to cover the pairs of fin structures 140, the source/drain regions and the sacrificial gate structures.

In step S212, the sacrificial gate structures may be replaced by functional gates stacks. The replacement may proceed in accordance with a replacement metal gate (RMG) flow. According to an RMG flow, gate trenches are formed on opposite sides of each respective insulating wall 128 by removing the sacrificial gate bodies (e.g. using a selective amorphous Si etch). Pairs of n-side and p-side gate trenches exposing the respective device layer stacks 142, 144 of the pairs of fin structures 140 may hence be formed, each pair of p-side and n-side gate trenches being separated by a respective insulating wall 128. The RMG flow may proceed by gate dielectric deposition (e.g. high-K dielectric such as $HfO_2$, HfSiO, LaO, AlO or ZrO), gate work function metal deposition and gate (metal) fill deposition.

The process may further comprise a step of channel release, interleaved in the RMG process: That is, subsequent to forming the gate trenches, selectively removing the first sacrificial layers 114 (and 118) of each device layer stack 142, 144 by selective etching of the first sacrificial material. Suspended channel layers 116 (e.g. nanosheets) may hence be defined in each gate trench. Due to the presence of the insulating wall 128, the channel layers 116 will be “partly released” in the sense that their upper and lower surfaces as well as outer sidewall surfaces may be laid bare while their inner sidewall surfaces abut the insulating wall 128.

For improved device performance a p-type work function metal (pWFM) may be provided in the p-type device region (e.g. in the p-side gate trench) and a n-type work function metal (nWFM) may be provided in the n-type device region (e.g. in the n-side gate trench). Step S212 may for example comprise sub-steps: S212*a* of pWFM deposition in the p- and n-type device regions; S212*b* of selective removal of the pWFM from the n-type device region; step S212*c* of nWFM deposition in the n-type device region, and optionally also the p-type device region; step S212*d* of gate fill deposition. The pWFM removal may comprise etching the pWFM in the n-type device region while masking the p-type device region. The insulating walls 128 may counteract lateral etching of the pWFM in the p-type device region. Examples of gate fill material include W, Al, Co or Ru. The nWFM and pWFM may be deposited in a conformal deposition process, such as ALD. The gate fill material may e.g. be deposited by CVD or PVD. In this sequence of sub-steps S212*a-d*, reference to "pWFM" may be substituted by "nWFM" and vice versa. Examples of nWFM include TiAl and TiAlC. Examples of pWFM include TiN and TaN.

Step S212 may be followed by step S214 of recessing the functional gate stacks, and optionally, gate cut formation, as per se is known in the art.

The method may further comprise forming source/drain contacts on the source/drain regions, e.g. by etching contact trenches in the ILD and depositing one of more contact metals therein.

Figure 18:
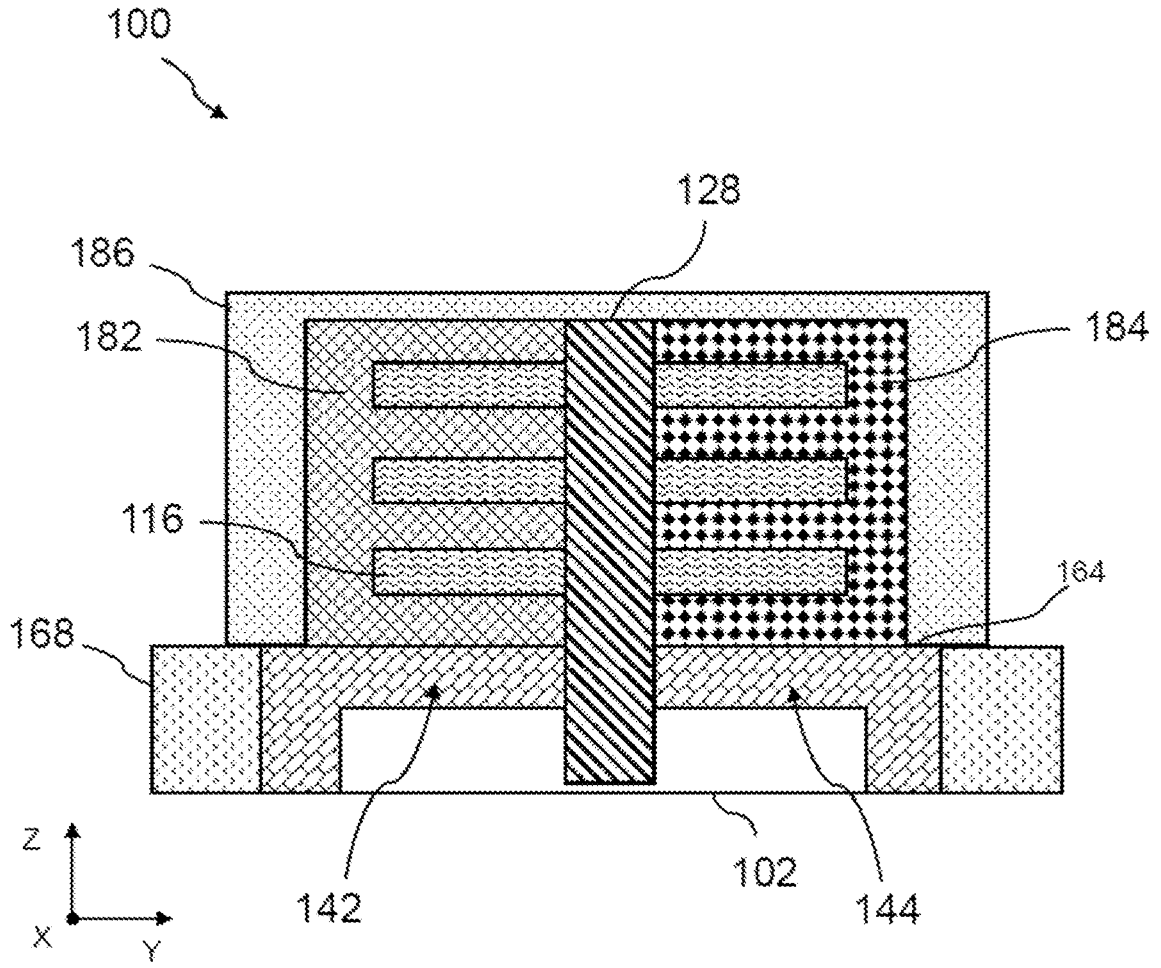
FIG. 18 is a schematic view of a forksheet device, according to some embodiments.

FIG. 18 schematically shows a cross sectional view of a forksheet device 100 which may be formed at one of the pairs of fin structures 140 using the above discussed process steps. The cross section is taken across the channel layers 116, through the gate stack. The gate stack comprises a first WFM 182 (e.g. nWFM or pWFM) deposited at the channel layers 116 of the first device layer stack 142 and second WFM 184 (e.g. pWFM or nWFM) deposited at the channel layers 116 of the second device layer stack 144. The first and second WFM metals 182, 184 and the first and second device layer stack 142, 144 are separated by the insulating wall 128. The respective portions of the gate stack accordingly each has a fork-like shape, with a number of prongs extending along and between the channel layers 116 of the respective FETs. The gate stack may further comprise a gate metal fill 186. In the illustrated example the gate stack extends across the wall 128 such that the p-side gate stack and the n-side gate stack are electrically connected. However it is also possible to form the n-side and p-side gate stacks to be disconnected by recessing the gate stack to a level below the insulating wall 128.

In the above, various aspects of the disclosure have been described with reference to a limited number of examples. However, as is readily appreciated by a person skilled in the art, other examples than the ones disclosed above are equally possible within the scope of the present disclosure, as defined by the appended claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a semiconductor device structure, the method comprising:

forming a layer stack on a substrate, the layer stack comprising sacrificial layers of a first semiconductor material and channel layers of a second semiconductor material, the channel layers alternating the sacrificial layers;

forming over the layer stack a plurality of parallel and regularly spaced core lines;

forming spacer lines on side surfaces of the core lines, wherein a width of the spacer lines is such that gaps are formed between spacer lines formed on neighboring core lines;

forming first trenches extending through the layer stack by etching the layer stack while using the core lines and the spacer lines as an etch mask;

forming insulating walls in the first trenches and in the gaps in a single deposition step by completely filling the first trenches and the gaps with a single insulating wall material;

subsequent to forming the insulating walls, removing the core lines selectively to the spacer lines and the insulating walls; and subsequent to removing the core lines, forming second trenches extending through the layer stack by etching the layer stack while using the spacer lines and the insulating walls as an etch mask, thereby forming a plurality of pairs of fin structures, each pair of fin structures comprising a first device layer stack and a second device layer stack separated by a respective insulating wall.

2. The method according to claim 1, wherein the first trenches are formed to extend into the substrate.

3. The method according to claim 1, wherein the second trenches are formed to extend into the substrate.

4. The method according to claim 1, wherein the first trenches are formed to extend to a first depth in the substrate and the second trenches are formed to extend to a second depth in the substrate different from the first depth.

5. The method according to claim 4, further comprising forming a shallow trench isolation layer in the second trenches by depositing an insulating material in the second trenches and etching back the insulating material to a level below a bottom-most channel layer of each pair of fin structures.

6. The method according to claim 1, wherein the insulating wall material is conformally deposited and the method further comprises exposing an upper surface of the core lines by subjecting the insulating wall material to a planarization and/or an etch back prior to removing the core lines.

7. The method according to claim 1, wherein the first semiconductor material is $Si_{1-y}Ge_y$ and the second semiconductor material is $Si_{1-x}Ge_x$, wherein $0 \le x < y$.

8. The method according to claim 1, wherein the layer stack further comprises a bottom sacrificial layer of a third semiconductor material underneath the sacrificial layers and the channel layers, and the method further comprises, subsequent to forming the second trenches:

removing the bottom sacrificial layer of the first and second device layer stacks of each pair of fin structures by selective etching of the third semiconductor material, thereby forming a respective cavity in the first and second device layer stacks on opposite sides of the insulating wall; and depositing a bottom insulating material in the cavities, wherein during the acts of removing the bottom sacrificial layer of the first and second device layer stacks of each pair of fin structures and depositing the bottom insulating material in the cavities, the sacrificial layers and the channel layers of the first and second device layer stacks are supported by the respective insulating walls.

9. The method according to claim 8, wherein the bottom insulating material is conformally deposited with a thickness such that the cavities are filled with the bottom insulating material, and the method further comprises removing the bottom insulating material from each first and second device layer stack above a level of the cavities.

10. The method according to claim 8, wherein a bottom-most one of the sacrificial layers is formed on the bottom sacrificial layer.

11. The method according to claim 8, wherein the first semiconductor material is $Si_{1-y}Ge_y$ and the second semiconductor material is $Si_{1-x}Ge_x$, wherein $0 \leq x < y$, wherein the third semiconductor material is $Si_{1-z}Ge_z$, wherein $y < z$.

12. The method according to claim 1, further comprising, processing the first and second layer stacks of each of at least a subset of the pairs of fin structures to form a first transistor device at the first device layer stack and a second transistor device at the second device layer stack, the processing comprising forming source and drain regions and forming gate stacks.

13. The method according to claim 12, wherein the processing further comprises, for each of the at least a subset of the pairs fin structures:

forming a sacrificial gate structure extending across the pair of fin structures and the insulating walls;

etching through the first and second device layer stacks of the pair of fin structures while using the sacrificial gate structure as an etch mask such that portions of sacrificial and channel layers of the first and second device layer stack are preserved underneath the sacrificial gate structure, forming source and drain regions by epitaxially growing semiconductor material on end surfaces of the respective channel layers of the first and second device layer stacks, at opposite sides of the sacrificial gate structure;

subsequently, removing the sacrificial gate body and thereafter removing the sacrificial layers of the first and second device layer stacks by selectively etching the first sacrificial semiconductor material; and subsequently forming a gate stack on the channel layers of the first and second device layer stacks.

14. The method according to claim 13, wherein the layer stack further comprises a bottom sacrificial layer of a third semiconductor material underneath the sacrificial layers and the channel layers, and the method further comprises, subsequent to forming the second trenches:

removing the bottom sacrificial layer of the first and second device layer stacks of each pair of fin structures by selective etching of the third semiconductor material, thereby forming a respective cavity in the first and second device layer stacks on opposite sides of the insulating wall; and depositing a bottom insulating material in the cavities, wherein during the acts of removing the bottom sacrificial layer of the first and second device layer stacks of each pair of fin structures and depositing the bottom insulating material in the cavities, the sacrificial layers and the channel layers of the first and second device layer stacks are supported by the respective insulating walls, wherein, subsequent to the processing, the bottom insulating material forms a bottom insulating layer underneath the source region, the drain region and the channels, on either side of the insulating wall.

15. The method according to claim 14, wherein the bottom insulating material is conformally deposited with a thickness such that the cavities are filled with the bottom insulating material, and the method further comprises removing the bottom insulating material from each first and second device layer stack above a level of the cavities.

16. The method according to claim 14, wherein a bottom-most one of the sacrificial layers is formed on the bottom sacrificial layer.

17. The method according to claim 14, wherein the first semiconductor material is $Si_{1-y}Ge_y$ and the second semiconductor material is $Si_{1-x}Ge_x$, wherein $0 \leq x < y$, wherein the third semiconductor material is $Si_{1-z}Ge_z$, wherein $y < z$.

18. The method according to claim 12, wherein the first trenches are formed to extend into the substrate.

19. The method according to claim 12, wherein the second trenches are formed to extend into the substrate.

20. A method for forming a semiconductor device structure, the method comprising:

forming a layer stack on a substrate, the layer stack comprising sacrificial layers of a first semiconductor material and channel layers of a second semiconductor material, the channel layers alternating the sacrificial layers;

forming over the layer stack a plurality of parallel and regularly spaced core lines;

forming spacer lines on side surfaces of the core lines, wherein a width of the spacer lines is such that gaps are formed between spacer lines formed on neighboring core lines;

forming first trenches extending through the layer stack by etching the layer stack while using the core lines and the spacer lines as an etch mask;

forming insulating walls in the first trenches and in the gaps by completely filling the first trenches and the gaps with insulating wall material;

subsequent to forming the insulating walls, removing the core lines selectively to the spacer lines and the insulating walls;

subsequent to removing the core lines, forming second trenches extending through the layer stack by etching the layer stack while using the spacer lines and the insulating walls as an etch mask, thereby forming a plurality of pairs of fin structures, each pair of fin structures comprising a first device layer stack and a second device layer stack separated by a respective insulating wall; and modifying at least one of the first device layer stack or the second device layer stack such that the first device layer stack is an n-type device and the second device layer stack is p-type device.

* * * * *